United States Patent [19]
Hu et al.

[11] Patent Number: 5,763,923
[45] Date of Patent: Jun. 9, 1998

[54] COMPOUND PVD TARGET MATERIAL FOR SEMICONDUCTOR METALLIZATION

[75] Inventors: Yong-Jun Hu; Pai-Hung Pan, both of Boise, Id.

[73] Assignee: Micron Technology, Inc., Boise, Id.

[21] Appl. No.: 696,377

[22] Filed: Aug. 13, 1996

[51] Int. Cl.⁶ .......................... H01L 29/76; H01L 29/94; H01L 31/062; H01L 31/113
[52] U.S. Cl. .......................... 257/382; 257/383; 257/384
[58] Field of Search .......................... 257/382, 383, 257/384, 412, 413

[56] References Cited

U.S. PATENT DOCUMENTS

| | | |
|---|---|---|
| 4,807,015 | 2/1989 | Robayashi et al. |
| 5,341,028 | 8/1994 | Yamaguchi et al. |
| 5,612,245 | 3/1997 | Saite . |
| 5,648,673 | 7/1997 | Yasuda . |

*Primary Examiner*—Stephen Meier
*Attorney, Agent, or Firm*—Workman, Nydegger & Seeley

[57] ABSTRACT

A novel compound PVD target material, suitable for use in the fabrication of cobalt silicide layers on semiconductor devices is disclosed. The compound material is formed by blending an amount of $SiO_z$ with an amount of $CoSi_x$ to form a blended compound material $CoSi_xO_y$ and then compressing and shaping said blended compound material in a hot powder press into an appropriate shape for use in a PVD sputtering chamber. A polysilicon MOSFET gate stack structure and a source/drain salicide structure incorporating the $CoSi_xO_y$ compound material are described. The addition of a small amount of oxide to the cobalt silicide, when sputter deposited, results in an as-deposited film of $CoSi_xO_y$ having smaller grain size and significantly enhanced thermal stability over conventional $CoSi_x$ and other characteristics desirable in the fabrication of salicide MOSFET structures.

25 Claims, 2 Drawing Sheets

COMPOUND PVD TARGET MATERIAL FOR SEMICONDUCTOR METALLIZATION

BACKGROUND OF THE INVENTION

1. The Field of the Invention

The present invention relates to a novel material which is useful in the fabrication of polysilicon gate MOS transistors. More specifically, this invention describes a novel target material for use in a physical vapor deposition (PVD) process that deposits a cobalt silicide film on amorphous, polycrystalline, or single crystalline silicon. The novel target material greatly improves the thermal stability of the as-deposited cobalt silicide film while retaining the properties of the cobalt silicide film which are desirable for its use as a polycide of gate electrodes as well as contact material in MOS transistor structures.

2. The Relevant Technology

As is well known in the art, polycrystalline silicon (polysilicon) is the preferred material for gate electrodes in MOSFET structures. Polysilicon is advantageous over metal gate electrodes as it can withstand much higher subsequent processing temperatures before eutectic temperatures are reached. Polysilicon is readily deposited on bulk silicon or $SiO_2$ using low pressure chemical vapor deposition (LPCVD), and the resistivities of doped polysilicon films are less than those of doped epitaxial or bulk silicon layers.

As the drive toward integrating more active devices on a single integrated circuit necessitates the fabrication of increasingly small MOSFET structures, the resistance of the MOSFET gate, source and drain contacts become limiting factors in device performance. It is therefore beneficial to use materials with the lowest possible bulk resistivities for making contacts with the MOSFET gate electrodes. To this end, it is well known that refractory metal silicides can be readily formed on silicon using conventional semiconductor sputtering, deposition, and annealing techniques. The refractory metal silicides have low sheet resistivities after annealing and also form low resistance ohmic contacts with commonly used interconnect metals.

Titanium disilicide ($TiSi_2$) is known to have a low potential sheet resistivity within the available refractory metal silicides, and is in widespread use as a metallization material in MOSFET structures. $TiSi_2$ is often unsuitable for use in particular MOSFET integrated circuit designs, however, due to limitations which result from its behavior during high temperature annealing steps wherein agglomeration (decomposition of $TiSi_2$) occurs. These limitations are well known to those skilled in the art.

Due to the limitations associated with $TiSi_2$, other refractory metal silicides are being investigated in more detail. In particular, cobalt silicides ($CoSi_x$) are being increasingly used in sub-micron MOSFET structures. The theoretical minimum resistivity of $CoSi_2$ is as low as that for $TiSi_2$ in a crystalline phase. Furthermore, $CoSi_x$ has other desirable properties, particularly those associated with epitaxial source/drain electrodes in self-aligned silicide (salicide) MOSFET structures. $CoSi_x$ is known to exhibit significantly smoother silicide formation during the formation of salicide, which allows for shallower source/drain junctions and reduced spacing between the source/drain junctions and the depletion region. This in turn allows for additional reduction in scaling of MOS devices before leakage current problems begin to appear. Furthermore, $CoSi_x$ is known to have properties which make it a superior dopant diffusion source over $TiSi_x$, particularly when boron or arsenic are used as dopants. $CoSi_x$ is also known as a fine grain material (well below 400Å) that has very small line-width dependent sheet resistance. This puts $CoSi_x$ as a good candidate for deep submicron IC application beyond 0.18 μm technology.

While $CoSi_x$ shows potential as a refractory metal silicide in MOSFET circuit fabrication, shortcomings are known to exist which limit its use. Specifically, the processing of $CoSi_2$/polysilicon layers at moderate temperatures has been shown to cause the layer structure to severely deteriorate due to silicon recrystallization and grain growth within the silicide, leading eventually to complete consumption of the polysilicon layer and inversion of the layer order.

$CoSi_x$ films can be readily deposited on silicon substrates using physical vapor deposition, also known as PVD or sputtering. Sputter deposition processes occur in vacuum chambers, and the source material used to sputter deposit onto the substrate is a solid slab known as a target. Sputtering has advantages in that no chemical compositional changes occur during the deposition process, and the exact stoichiometry of the as-deposited material can be precisely regulated by regulating the composition of the target material. Alternately, controlled impurities can be introduced in the chamber during the sputtering process to affect the composition of the as-deposited film. For other silicides such as $TiSi_x$, much is known about the effect such modifications have on the behavior and interactions of the silicide during further processing stages. Much less is known about the behavior of deposited $CoSi_x$ films, however, so shortcomings remain in the application of $CoSi_x$ remain.

For $CoSi_x$ to be effective as a metallization material in submicron polysilicon MOSFET fabrication, and for its other superior characteristics to fully utilized, it is clear that improvements are needed in the fabrication and processing of $CoSi_x$ films. More specifically, improvements are needed which will better control the grain size of as-deposited $CoSi_x$ films, and thereby the stability of the films during annealing.

SUMMARY OF THE INVENTION

According to an aspect of the invention, the novel target material is created by the steps of: Blending a small amount of $SiO_z$ material and $CoSi_x$ material; and applying pressure to the blended material in a hot powder press to form a target material composed of the compound $CoSi_xO_y$. The novel target can then be used in a PVD application for forming semiconductor structures.

According to another aspect of the invention, a method of fabricating a semiconductor device gate stack is provided, including the steps of: depositing an insulating film and a polysilicon film on a silicon substrate; patterning the insulating film and the polysilicon film into a gate oxide layer and a polysilicon gate on a selected portion of the silicon substrate while leaving another portion of the silicon substrate exposed; sputter depositing a film of the compound $CoSi_xO_y$ onto the wafer; and forming an insulating spacer along the side walls of the gate stack. In the foregoing steps, the film of the compound $CoSi_xO_y$ is formed into a metallization layer on the silicon substrate over the source/drain regions associated with a shallow junction region, and the film is also formed at the top of the gate stack to form a gate electrode. The depth of the shallow junction region will preferably be less than about 2000 Å. Ion implantation can then be made into the film of co-deposited $CoSi_xO_y$ over the source/drain regions where it will be used as a diffusion barrier, or the ion implantation can be made through and clear of the film of co-deposited $CoSi_xO_y$ and into the silicon substrate. A conductive plug can then be formed on top of the metallization layer upon which a metal fill material such as aluminum can be positioned.

As will be shown, by proper selection of the layer depths and $CoSi_xO_y$ stoichiometry. $CoSi_xO_y$ polycide and salicide structures can be created that have superior thermal stability characteristics.

BRIEF DESCRIPTION OF THE DRAWINGS

In order that the manner in which the above-recited and other advantages and objects of the invention are obtained may be more fully explained, a more particular description of the invention briefly described above will be rendered by reference to specific embodiments and applications thereof which are illustrated in the appended drawings. Understanding that these drawings depict only typical embodiments and applications of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Additional objects and advantages of the present invention will become readily apparent to those skilled in this art from the following detailed description, wherein preferred embodiments of the invention are shown and described in the disclosure, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

Figure 1:
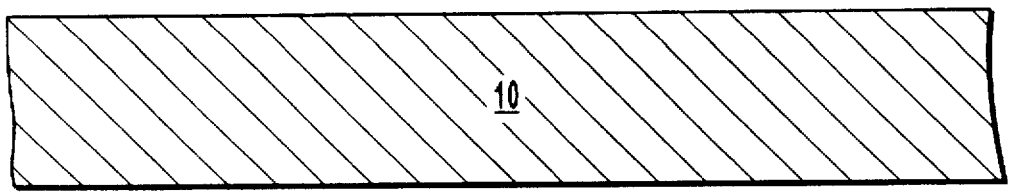
FIG. 1 is a cross sectional illustration of a PVD target formed from the compound $CoSi_xO_y$ material.

The invention of a novel PVD target material compound which significantly increases thermal stability of annealed cobalt disilicide films is disclosed. The PVD target material compound is formed using conventional processing steps by combining a small amount of $SiO_z$ with $CoSi_x$. In the preferred embodiment, x is chosen to be in a range of about 1.4 to about 2.2, and more preferably about 1.64. The variable z is chosen so that the resulting y will be in a range of about 0.010 to about 0.100 and, more preferably, about 0.039, although other values could be selected for a given z. The material is then blended into a mixture using known mixing techniques. The mixture of blended material is then placed in a hot powder press to be compressed and shaped at conventional hot powder press temperatures and pressures so as to form a target slab composed of the compound $CoSi_xO_y$. The shape of the target slab can be selected to be of appropriate dimensions for use in a sputtering chamber. The target slab, an example of which is seen at 10 in FIG. 1, may be used in conventional PVD sputtering process steps to deposit $CoSi_xO_y$ films on a semiconductor wafers in standard sputtering chambers. Typically, thermal stability and bulk resistivity of $CoSi_xO_y$ increase with value of y. There is a trade-off here to keep y small to maintain low bulk resistivity and achieve reasonable thermal stability. For gate electrode application, bulk resistivity up to 200 µ-Ohm-cm is acceptable. Preferably, a layer composed of $CoSi_xO_y$ will have a bulk resistivity in a range of about 12 µ-Ohm-cm to about 200 µOhm-cm.

The selected value of y in $CoSi_xO_y$ determines the amount of oxide that will be within the resultant cobalt silicide film. The presence of oxide within the cobalt silicide film effectively restricts the migration of cobalt or silicon which is known to occur during high temperature annealing stages wherein polycide or salicide is formed. The oxide increases the overall sheet resistivity of the cobalt silicide film, but when used in small amounts as in the preferred embodiment, bulk resistivities of the cobalt silicide films have been observed to remain in a range of about 25 to about 26 µ-Ohm-cm after annealing with no measurable change in resistivity value after repeated rapid thermal annealing steps at 1000° C. This is only as twice as much of the bulk resistivity (12–15 µ-Ohm-cm) of pure $CoSi_{2.0}$, which is still considered to be a very low bulk resistivity. Furthermore, these results have been demonstrated for films as thin as 250 Åthat are deposited directly over amorphous silicon and polysilicon layers such as would be found in polysilicon MOSFET gate stacks. These results have been demonstrated for films deposited directly on epitaxial silicon such as would be the case for source/drain contacts.

Observations on as-deposited and annealed films which have been fabricated from the compound $CoSi_xO_y$ reveal the average grain sizes to remain well under 10 nanometers. This fine grain material is an excellent candidate for deep submicron IC application because it has very small linewidth dependent changes on bulk resistivity. The small grain sizes also make for a smooth surface, and serves to limit the migration of silicon into and through the $CoSi_xO_y$ layer. In addition to enhancing the overall stability of the $CoSi_xO_y$ layer, the limited migration of silicon into and through the $CoSi_xO_y$ layer reduces consumption of silicon when a $CoSi_xO_y$ layer has been deposited on an epitaxial silicon substrate. This in turn enables the fabrication of source/drain contacts to sufficiently shallow junction to minimize channel shorting effects, even when the MOSFET structures are scaled down to the deep submicron level.

While a preferred embodiment has been disclosed having specific values of x=1.64 and y=0.039 for $CoSi_xO_y$ and $SiO_z$, other values for x and z could be used, depending the optimal trade-off between sheet resistivity, thermal stability, and grain size for a given application. The amount of $SiO_z$ cab be varied depending upon sheet resistivity, thermal stability, and dry etch selectivity requirements. As such, a series of compounds of $CoSi_xO_y$ can be made as "z" varies.

Figure 2:
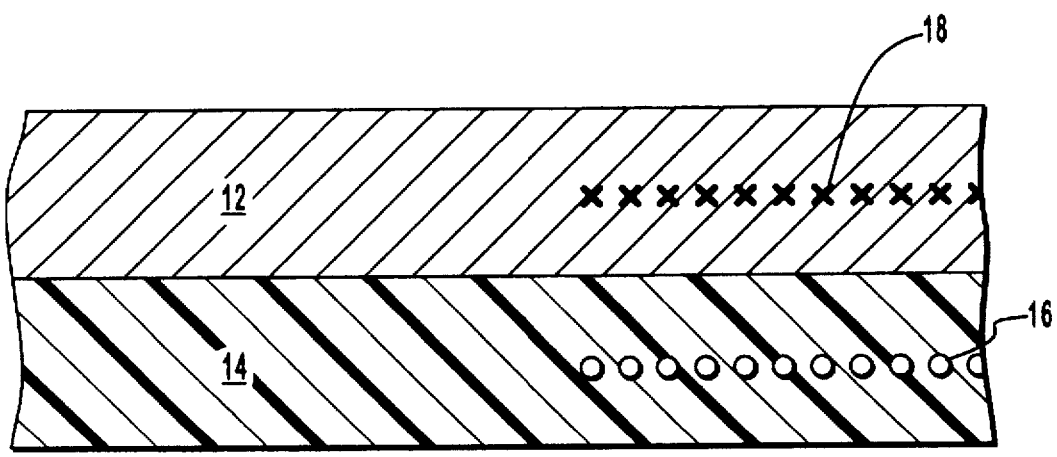
FIG. 2 is a cross sectional view of a layer of $CoSi_xO_y$ deposited on a p-doped silicon substrate, and showing ion implantation into both the layer of $CoSi_xO_y$ and the p-doped silicon substrate.

Examples of the use of the novel target material of the invention are describe herein with respect to FIGS. 2 though 5.

In FIG. 2, a $CoSi_xO_y$ layer 12 has been sputter deposited onto a p-doped silicon substrate 14 of a semiconductor wafer, although an n-doped silicon substrate could be similarly treated. $CoSi_xO_y$ layer 12 can be used as a diffusion barrier, and ions 16 can be implanted through $CoSi_xO_y$ layer 12 into p-doped silicon substrate 14 prior to an anneal step. Alternatively, ions 18 can be implanted into $CoSi_xO_y$ layer 12 prior to the anneal step.

Figure 3:
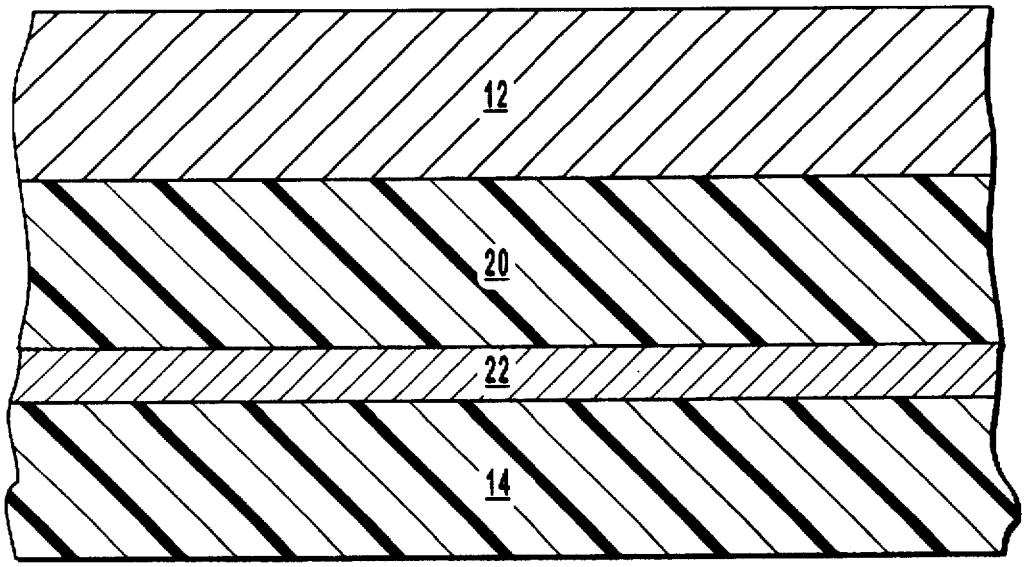
FIG. 3 is a cross sectional view of a stack that includes a layer of $CoSi_xO_y$ deposited on a layer of polysilicon which is deposited on a gate oxide layer, the gate oxide layer being situated upon a p-doped silicon substrate.

In FIG. 3, a stack has been formed that includes $CoSi_xO_y$ layer 12 deposited on a polysilicon layer 20 upon a gate oxide layer 22, the gate oxide layer being deposited on a p-doped silicon substrate 14 of a semiconductor wafer.

Figure 4:
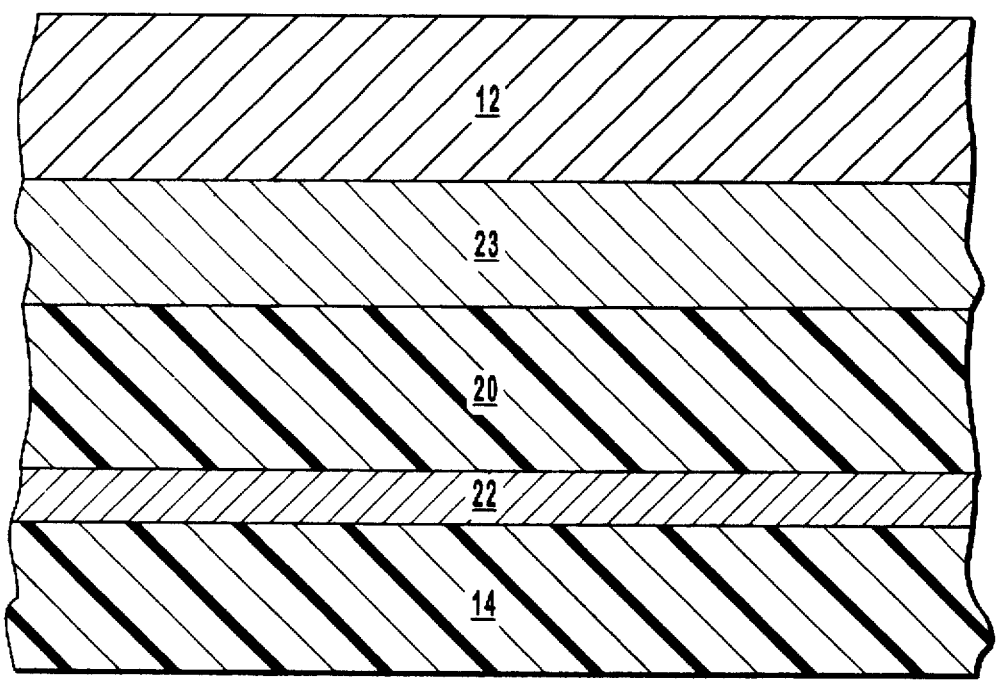
FIG. 4 shows the stack of FIG. 3, with a layer of amorphous silicon interposed between the layer of polysilicon and the layer of $CoSi_xO_y$.

FIG. 4 shows the stack seen in FIG. 3 but also includes an interposed layer of amorphous silicon 23 in between $CoSi_xO_y$ layer 12 and polysilicon layer 20.

Figure 5:
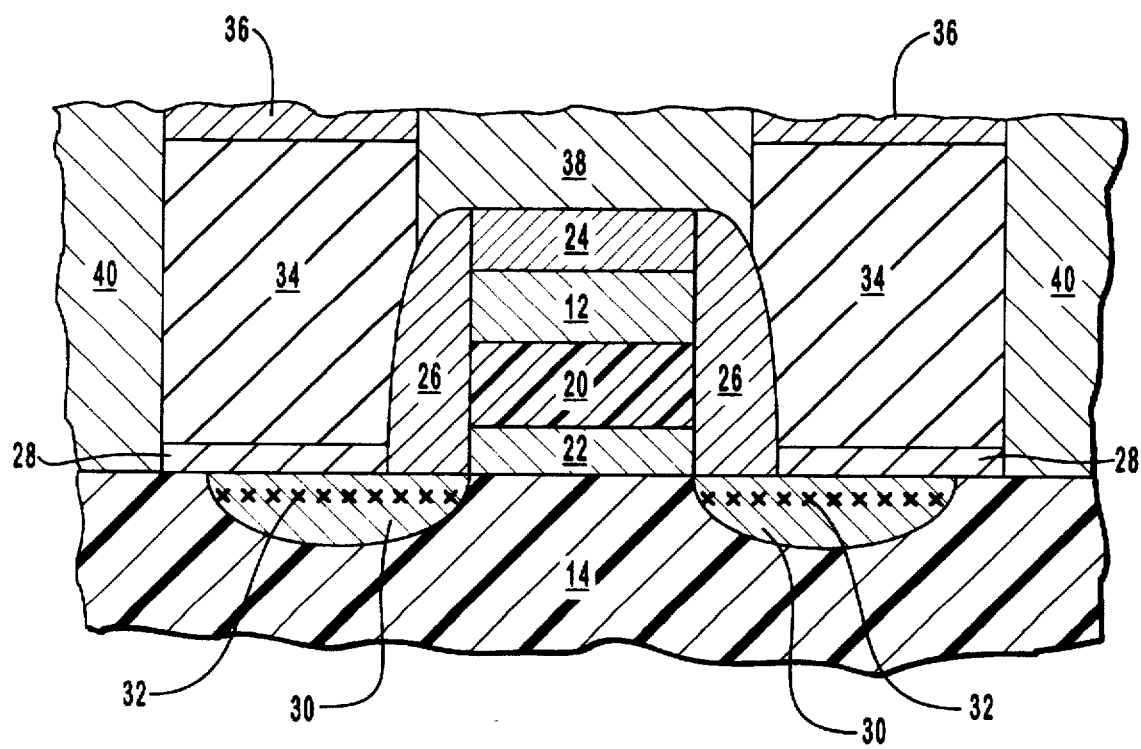
FIG. 5 is a simplified cross sectional schematic of a gate stack including the layer of the stack seen in FIG. 3, with a layer of oxide deposited on the layer of $CoSi_x O_y$, the gate stack being laterally covered by a TEOS side wall spacer positioned upon a shallow implanted source/drain junction, the shallow implanted junction also having deposited thereon a layer of $CoSi_xO_y$ upon which a laterally isolated contact plug is positioned at an end thereof with an electrically conductive layer contacting an opposite end of the contact plug.

A MOSFET polysilicon gate stack is shown in FIG. 5, which features the gate stack of FIG. 3 plus a layer 24 of oxide (or an insulating layer) deposited on $CoSi_xO_y$ layer 12. Alternatively, FIG. 5 can also be interpreted to represent the gate stack of FIG. 4 plus a layer 24 of oxide deposited on $CoSi_xO_y$ layer 12. The gate stack of FIG. 5 is laterally surrounded by TEOS side wall spacers 26, which may optionally also be formed of silicon nitride. TEOS side wall spacers 26 are positioned upon source/drain regions 30 which have been implanted with ions 32 and are covered by a layer 28 of $CoSi_xO_y$. By way of example, ions 32 can be elements such as P, N, Co, W, and Mo, although others are also contemplated. The purpose of the implantation of ions 32 is to further improve $CoSi_xO_y$ thermal stability at the Si substrate surface where the dose of ions 32 should be smaller and shallower than typical source/drain ion implantations such that the presence of ions 32 does not affect MOS device performance.

Source/drain regions 30 can be implanted with ions through $CoSi_xO_y$ layer 28 into p-doped silicon substrate 14 prior to an anneal step. Alternatively, ions can be implanted directed into layer 28 of $CoSi_xO_y$, similar to what is depicted in FIG. 2. An anneal step can then follow.

Preferably, source/drain regions 30 have a depth of less than about 2000 Å. An electrically conductive plug 34 is positioned at an end thereof upon layer 28 and is contacted at an opposite end thereof with an electrically conductive material 36, such as aluminum. Plug 34 can be composed, for example, of tungsten or polysilicon. Each plug 34 is electrically isolated from another plug 34 by insulative layers 38, 40.

The structures seen in FIGS. 2–5 can be formed by convention processing steps using the novel compound $CoSi_xO_y$ as a PVD target in a sputtering deposition.

As described herein, the present invention takes advantage of $SiO_2$ mixed with $CoSi_x$ to form a compound material of $CoSi_xO_y$. The compound of $CoSi_xO_y$ is formed into a target slab that is sputter deposited as a $CoSi_xO_y$ film having superior grain structure. The grain structure of the $CoSi_xO_y$ film restricts the movement of cobalt and silicon during high temperature processing, and produces layers and structures incorporating cobalt silicide oxide that have greatly improved thermal stability and reliability over conventional $CoSi_x$ film for use in fabrication of submicron MOSFET devices.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A structure situated on a semiconductor wafer comprising:

a silicon substrate of said semiconductor wafer;

an oxide layer deposited on the silicon substrate;

a polysilicon layer deposited on said oxide layer; and a layer composed of $CoSi_xO_y$ deposited on said polysilicon layer.

2. A structure situated on a semiconductor wafer as defined in claim 1, wherein the layer composed of $CoSi_xO_y$ has a bulk resistivity in a range of about 12 to about 200 µOhm-cm.

3. A structure situated on a semiconductor wafer as defined in claim 1, wherein the layer composed of $CoSi_xO_y$ has a thickness greater than about 250 Å.

4. The structure situated on a semiconductor wafer as defined in claim 1, wherein the $CoSi_xO_y$ of the layer composed of $CoSi_xO_y$ has an average grain size less than about 10 nanometers.

5. The structure situated on a semiconductor wafer as defined in claim 1, further comprising a diffusion barrier matrix comprising a plurality of ions implanted within the layer composed of $CoSi_xO_y$ at a selected depth.

6. A structure situated on a semiconductor wafer comprising:

a silicon substrate of said semiconductor wafer;

an oxide layer deposited on the silicon substrate;

a polysilicon layer deposited on said oxide layer;

an amorphous silicon layer deposited on the polysilicon substrate; and a layer composed of $CoSi_xO_y$ deposited on said amorphous silicon layer.

7. The structure situated on a semiconductor wafer as defined in claim 6, further comprising a diffusion barrier matrix comprising a plurality of ions implanted within the layer composed of $CoSi_xO_y$ at a selected depth.

8. The structure situated on a semiconductor wafer as defined in claim 6, wherein said plurality of ions are elements selected from the group consisting of P, N, Co, W, and Mo.

9. A MOS device structure situated on a semiconductor wafer and comprising:

a gate oxide layer deposited on a silicon substrate of said semiconductor wafer;

a polysilicon gate layer deposited on said gate oxide layer, a layer composed of $CoSi_xO_y$ deposited on said polysilicon gate layer; and a top oxide layer deposited on said layer composed of $CoSi_xO_y$.

10. The MOS device structure situated on a semiconductor wafer as defined in claim 9, further comprising a side wall spacer composed of an electrical insulating material, wherein the top oxide layer, the layer composed of $CoSi_xO_y$, the polysilicon gate layer, and the gate oxide layer all extend laterally to make contact with and terminate at said side wall spacer.

11. The MOS device structure situated on a semiconductor wafer as defined in claim 10, further comprising:

a source-drain region in said silicon substrate in contact with said side wall spacer, a plug contact layer being composed of $CoSi_xO_y$ deposited on the silicon substrate over said source-drain region, said side wall spacer laterally extending to terminate in contact with said plug contact layer; and an electrically conductive layer deposited on said a plug contact layer, said side wall spacer laterally extending to terminate in contact with said electrically conductive layer.

12. The MOS device structure situated on a semiconductor wafer as defined in claim 9, wherein the layer composed of $CoSi_xO_y$ has a thickness greater than about 500 Å.

13. The MOS device structure situated on a semiconductor wafer as defined in claim 9, wherein the $CoSi_xO_y$ of the layer composed of $CoSi_xO_y$ has an average grain size less than about 10 nanometers.

14. A MOS device structure situated on a semiconductor wafer and comprising:

a gate oxide layer deposited on a silicon substrate of said semiconductor wafer;

a polysilicon gate layer deposited on said gate oxide layer, a layer composed of $CoSi_xO_y$ deposited on said polysilicon gate layer;

a top oxide layer deposited on said layer composed of $CoSi_xO_y$.

a side wall spacer composed of an electrical insulating material, wherein the top oxide layer, the layer composed of $CoSi_xO_y$, the polysilicon gate layer, and the gate oxide layer all extend laterally to make contact with and terminate at said side wall spacer;

a source-drain region in said silicon substrate in contact with said side wall spacer, plug contact layer being composed of $CoSi_xO_y$ deposited on the silicon substrate over said source-drain region, said side wall spacer laterally extending to terminate in contact with said plug contact layer; and an electrically conductive layer deposited on said a plug contact layer, said side wall spacer laterally extending to terminate in contact with said electrically conductive layer.

15. A structure comprising:

a silicon substrate;

a layer composed of $CoSi_xO_y$ on said silicon substrate.

16. The structure as defined in claim 15, further comprising a diffusion barrier within the silicon substrate, said diffusion barrier being composed of a material selected from a group consisting of P, N, Co, W, and Mo.

17. The structure as defined in claim 15, further comprising a diffusion barrier within the layer composed of $CoSi_xO_y$, said diffusion barrier being composed of a material selected from a group consisting of P, N, Co, W, and Mo.

18. A structure comprising:

a semiconductor substrate;

a dielectric layer on the semiconductor substrate;

an electrically conductive layer on the dielectric layer; and a layer composed of $CoSi_xO_y$ on said electrically conductive layer.

19. The structure as defined in claim 18, wherein the active area has a diffusion barrier there composed of a material selected from a group consisting of P, N, Co, W, and Mo.

20. The structure as defined in claim 18, wherein x is in a range of about 1.4 to about 2.2, and y is in a range of about 0.010 to about 0.100.

21. A structure comprising:

a semiconductor substrate;

a silicon dioxide layer on the semiconductor substrate;

a polysilicon layer on the silicon dioxide layer;

an amorphous silicon layer on the polysilicon layer; and a layer composed of $CoSi_xO_y$ on said amorphous silicon layer.

22. The structure as defined in claim 21, wherein x is in a range of about 1.4 to about 2.2, and y is in a range of about 0.010 to about 0.100.

23. An structure comprising:

a semiconductor substrate;

a first layer of silicon dioxide layer on the semiconductor substrate;

a polysilicon layer on said first layer of silicon dioxide, a first layer composed of $CoSi_xO_y$ on said polysilicon layer;

a second layer of silicon dioxide layer on said layer composed of $CoSi_xO_y$;

an electrical insulating material being in contact with the second layer of silicon dioxide layer, the layer composed of $CoSi_xO_y$, the polysilicon layer, and the first layer of silicon dioxide layer;

an active area within said semiconductor substrate in contact with said electrical insulating material;

a second layer composed of $CoSi_xO_y$ on the active area and in contact with said electrical insulating material; and an electrically conductive material on said second layer composed of $CoSi_xO_y$ and in contact with said said electrical insulating material.

24. The structure as defined in claim 23, wherein x is in a range of about 1.4 to about 2.2, and y is in a range of about 0.010 to about 0. 100.

25. The structure as defined in claim 23, wherein the active area has a diffusion barrier therein composed of a material selected from a group consisting of P, N, Co, W, and Mo.

* * * * *

UNITED STATES PATENT AND TRADEMARK OFFICE
CERTIFICATE OF CORRECTION

PATENT NO. : 5,763,923
DATED : June 9, 1998
INVENTOR(S) : Yong-Jun, et. al.

It is certified that error appears in the above-identified patent and that said Letters Patent is hereby corrected as shown below:

Item [56],

Cover Page, U.S. Patent Documents, line 1, change "Robayashi" to --Kobayashi--

Col. 2, line 31, after "to" insert --be--

Col. 4, line 11, after "on" delete --a--

Col. 4, line 35, before "are" change " that" to -- that--

Col. 4, line 59, after "depending" insert --on--

Col. 5, line 37, before "into" change "directed" to --directly--

Col. 5, line 49, before "processing" change "convention" to --conventional--

Col. 8, line 48, after "about" change "0. 100." to --0.100.--

Signed and Sealed this

Ninth Day of March, 1999

*Attest:*

Q. TODD DICKINSON

*Attesting Officer*     *Acting Commissioner of Patents and Trademarks*